(12) United States Patent
Oka et al.

(10) Patent No.: US 10,530,123 B2
(45) Date of Patent: Jan. 7, 2020

(54) DRIVE CIRCUIT AND LIGHT EMITTING DEVICE

(71) Applicants: Yuuki Oka, Miyagi (JP); Tsuyoshi Ueno, Miyagi (JP); Seiya Abe, Fukuoka (JP)

(72) Inventors: Yuuki Oka, Miyagi (JP); Tsuyoshi Ueno, Miyagi (JP); Seiya Abe, Fukuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/918,154

(22) Filed: Mar. 12, 2018

(65) Prior Publication Data

US 2018/0269651 A1   Sep. 20, 2018

(30) Foreign Application Priority Data

Mar. 17, 2017   (JP) .................................. 2017-053047

(51) Int. Cl.
| | |
|---|---|
| *H01S 5/042* | (2006.01) |
| *H02M 1/32* | (2007.01) |
| *H02M 1/36* | (2007.01) |
| *H02M 3/158* | (2006.01) |
| *H05B 33/08* | (2006.01) |

(52) U.S. Cl.
CPC .............. *H01S 5/042* (2013.01); *H02M 1/32* (2013.01); *H02M 1/36* (2013.01); *H02M 3/1588* (2013.01); *H05B 33/0815* (2013.01); *Y02B 70/1466* (2013.01)

(58) Field of Classification Search
CPC .. H02M 3/158; H02M 3/1582; H02M 3/1584; H02M 3/1588; H01S 5/0261; H01S 5/042–0428; H05B 33/0815
See application file for complete search history.

(56) References Cited

U.S. PATENT DOCUMENTS

| | | | | |
|---|---|---|---|---|
| 5,604,759 A | * | 2/1997 | Miyaki | ................... H01S 5/042 372/26 |
| 5,736,881 A | * | 4/1998 | Ortiz | ....................... H01S 5/042 323/269 |
| 2014/0070781 A1 | | 3/2014 | Yanagida | |
| 2016/0094003 A1 | | 3/2016 | Numata et al. | |
| 2016/0094006 A1 | | 3/2016 | Hageta et al. | |

(Continued)

FOREIGN PATENT DOCUMENTS

| | | |
|---|---|---|
| JP | 05-204470 | 8/1993 |
| JP | 2013-110059 | 6/2013 |

(Continued)

OTHER PUBLICATIONS

Extended European Search Report dated Jul. 26, 2018.

*Primary Examiner* — Xinning(Tom) Niu
*Assistant Examiner* — Sean P Hagan
(74) *Attorney, Agent, or Firm* — Harness, Dickey & Pierce, P.L.C.

(57) ABSTRACT

A drive circuit is configured to supply a current to a light emitting element. The drive circuit includes a plurality of switching elements configured to switch between ON/OFF states with a modulation signal, a capacitor connected in parallel with the light emitting element, and a control module configured to control the switching elements so that a voltage of the capacitor does not become lower than a threshold.

18 Claims, 15 Drawing Sheets

(56) References Cited

U.S. PATENT DOCUMENTS

| | | |
|---|---|---|
| 2016/0094009 A1 | 3/2016 | Izumiya et al. |
| 2016/0336716 A1 | 11/2016 | Adachi et al. |
| 2017/0318634 A1* | 11/2017 | Motomura ......... H05B 33/0845 |

FOREIGN PATENT DOCUMENTS

| | | |
|---|---|---|
| JP | 2016-018943 | 2/2016 |
| JP | 2016-072610 | 5/2016 |
| JP | 2016-072611 | 5/2016 |
| JP | 2016-072617 | 5/2016 |
| JP | 2016-174136 | 9/2016 |
| JP | 2016-174137 | 9/2016 |
| JP | 2016-213412 | 12/2016 |

* cited by examiner

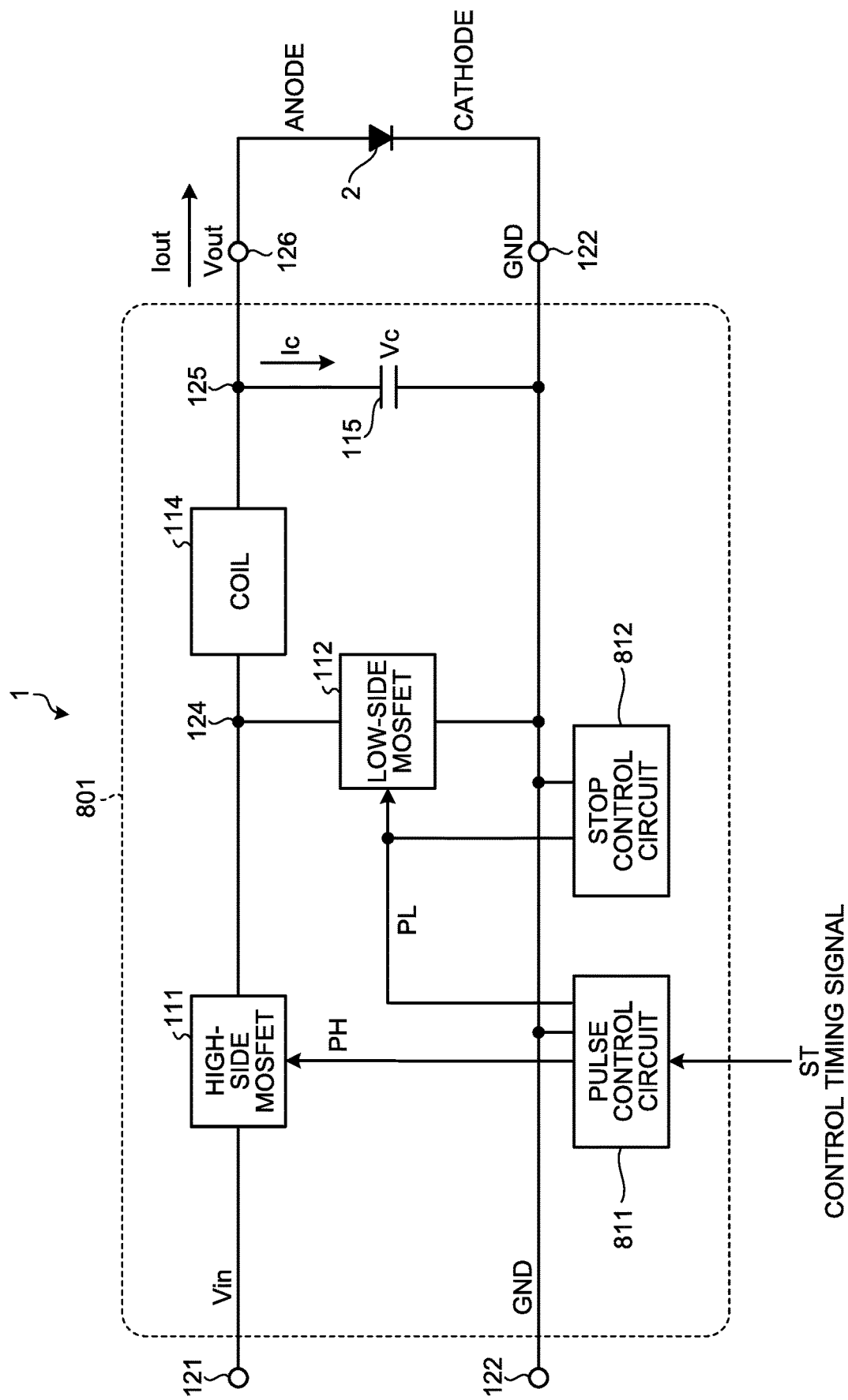

DRIVE CIRCUIT AND LIGHT EMITTING DEVICE

CROSS-REFERENCE TO RELATED APPLICATIONS

The present application claims priority under 35 U.S.C. § 119 to Japanese Patent Application No. 2017-053047, filed on Mar. 17, 2017. The contents of which are incorporated herein by reference in their entirety.

BACKGROUND OF THE INVENTION

1. Field of the Invention

The present invention relates to a drive circuit and a light emitting device.

2. Description of the Related Art

A light, emitting device that drives a light emitting element such as a laser diode (hereinafter, abbreviated as LD) and a light emitting diode (LED) includes a drive circuit that supplies a driving current to the light emitting element. As a system for generating the driving current, there are known a continuous control system and a switching control system. In the switching control system, control can be performed to cause a current to flow as much as necessary with a pulse modulation signal, so that a circuit loss thereof is smaller than that of the continuous control system, and the switching control system is advantageous in view of power conversion efficiency, a size, and the like. As the switching control system, there is known a synchronous rectification system. The synchronous rectification system is a system for supplying a current to a load such as a light emitting element utilizing a plurality of switching elements the ON/OFF of which is alternately switched with the pulse modulation signal. The synchronous rectification system can achieve power conversion efficiency higher than that of a diode rectification system.

As an example of the diode rectification system, what is disclosed is a drive circuit including a switch circuit arranged in series with an electronic device and a control circuit that performs switching-control on the switch circuit with a pulse modulation signal having a frequency higher than a response frequency of a control target in accordance with a control signal for input (Japanese Unexamined Patent Application Publication No. 05-204470).

The drive circuit of the synchronous rectification system utilizes a capacitor for smoothing a voltage applied to the load. The capacitor accumulates electric charges so that a stable voltage is applied to the load. However, when sufficient electric charges are not accumulated in the capacitor, the electric charge supplied from a power supply is first used for accumulating the electric charges in the capacitor, so that a delay (error) is caused between a control timing at which an output of the driving current to the load is instructed and an output timing at which the driving current is actually output to the load. When sufficient electric charges are not accumulated in the capacitor at the time when output of the drive circuit is started, for example, the switching element and the like may be broken due to generation of a rush current into the capacitor.

The present invention is made in view of such a situation, and prevents a control delay and a rush current from being generated in a drive circuit of a synchronous rectification system.

SUMMARY OF THE INVENTION

Brief Description of the Drawings

FIG. 16 is a diagram exemplifying a configuration of a light emitting device according to an eighth embodiment.

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
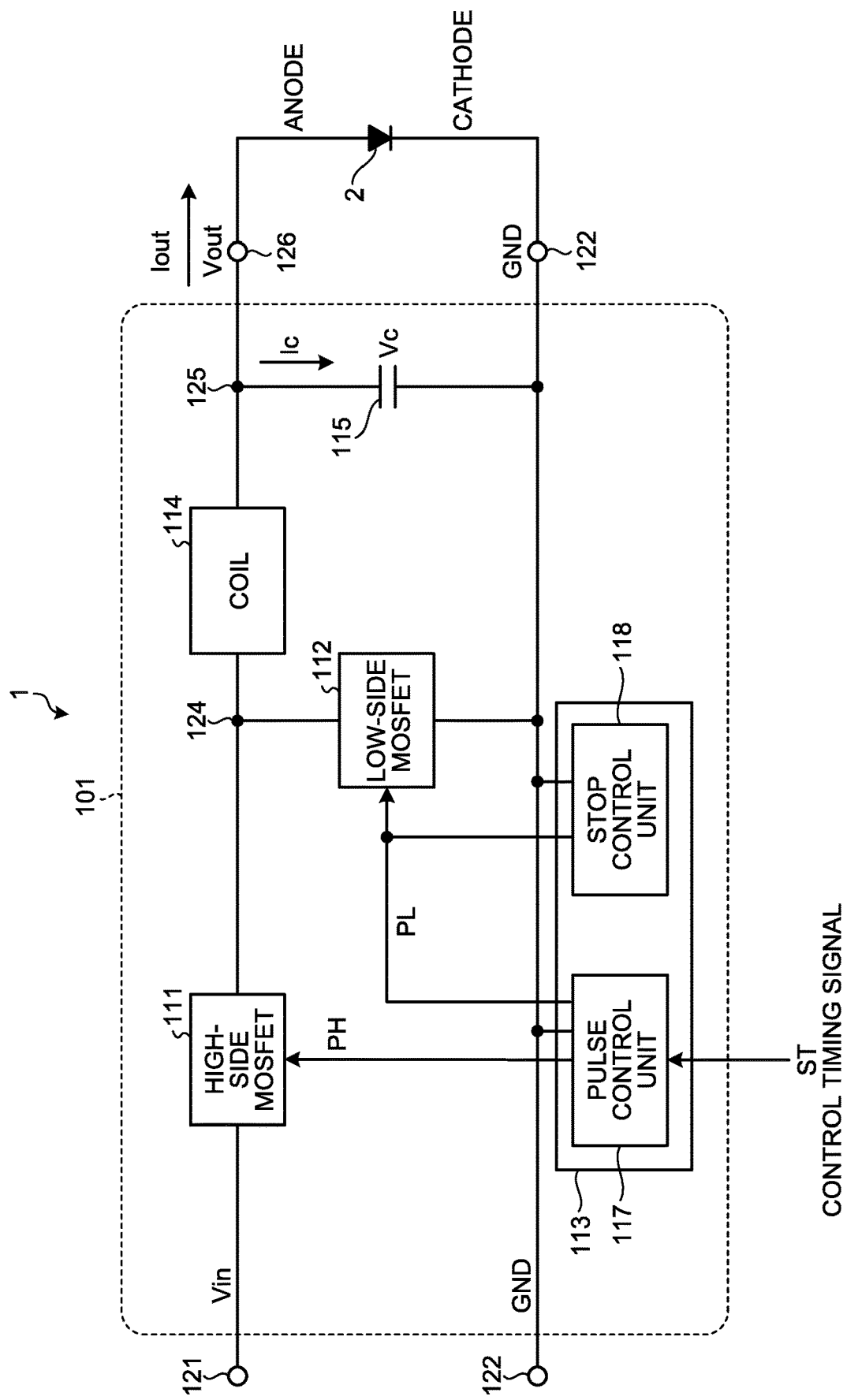
FIG. 1 is a diagram exemplifying a configuration of a light emitting device according to a first embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of clarity. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

The following describes embodiments of a drive circuit and a light emitting device in detail with reference to the attached drawings. The present invention is not limited to the following embodiments. Components in the following embodiments include a component that is easily conceivable by those skilled in the art, substantially the same component, and what is called an equivalent. The components can be variously omitted, replaced, modified, and combined with each other without departing from the gist of the following embodiments.

First Embodiment

FIG. 1 is a diagram exemplifying a configuration of a light emitting device 1 according to a first embodiment. The light emitting device 1 includes an LD 2 (light emitting element) and a drive circuit 101. The LD 2 is a light emitting element that is caused to emit light by a driving current (output current Iout) supplied from the drive circuit 101.

The drive circuit 101 according to the present embodiment includes a high-side metal-oxide-semiconductor field-effect transistor (MOSFET) (hereinafter, abbreviated as an HFET) 111 (first switching element), a low-side MOSFET (hereinafter, abbreviated as an LFET) 112 (second switching element), a control circuit 113 (control module), a coil 114 (inductor), and a capacitor 115.

The drive circuit 101 is a circuit that generates a driving current for the LD 2 using a synchronous rectification system. The drive circuit 101 performs pulse width modulation (PWM) control on an input voltage Vin output from a constant voltage source and input through a power supply terminal 121 using the HFET 111 and the LFET 112 to output the output current Iout to be the driving current for the LD 2.

The HFET 111 and the LFET 112 according to the present embodiment cause a current to flow in an ON state, and cut off the current in an OFF state. The control circuit 113 is a circuit that controls switching between ON and OFF of the HFET 111 and the LFET 112. The control circuit 113 includes a gate driver that controls a gate voltage of the HFET 111 and the LFET 112. The gate driver has a function of outputting a pulse width modulation signal, a function of controlling a pulse width. (duty ratio), and the like, and may be configured by utilizing a voltage control integrated circuit (IC), a current control IC, a microcomputer, a field-programmable gate array (FPGA), and the like. The microcomputer and the FPGA may be configured by utilizing a central processing unit (CPU), a read only memory (ROM) that stores therein a computer program for controlling the CPU, a random access memory (RAM) serving as a working area of the CPU, and the like. A specific function of the control circuit 113 will be described later.

The coil 114 has a function of accumulating the current output from the HEFT 111 and smoothing the output current Iout. Examples of material used for a magnetic body core constituting the coil 114 include a ferrite material such as Mn—Zn based ferrite and Ni—Zn based ferrite, and an iron-based material. The shape of the coil 114 may be appropriately determined in accordance with a substrate size and the like.

The capacitor 115 is connected in parallel with the LD 2, and has a function of smoothing an output voltage Vout. As the capacitor 115, a long-life capacitor such as a ceramic capacitor is preferably used. For example, when an electrolytic capacitor is used, a service life may be shortened, a size of a device may be increased, and the like. It is preferable to select a ceramic capacitor having low parasitic resistance or a small parasitic capacitance.

The HFET 111 switches between ON/OFF states of an electric path that connects a power supply potential with the capacitor 115. The LFET 112 switches between ON/OFF states of an electric path that connects the capacitor 115 with a ground potential. That is, electric charges are accumulated in the capacitor 115 when the HFET 111 is in the ON state (when the LFET 112 is in the OFF state), and the electric charges accumulated in the capacitor 115 are caused to flow out (be discharged) when the LFET 112 is in the ON state (when the HFET 111 is in the OFF state).

In the example illustrated in FIG. 1, the HFET 111 is connected between the power supply terminal 121 and a first intermediate terminal 124. An input voltage Vin of direct current higher than a voltage required for driving the LD 2 is input to the power supply terminal 121. The LFET 112 is connected between the first intermediate terminal 124 and a grounding terminal 122. The coil 114 is connected between the first intermediate terminal 124 and an output terminal 126 (second intermediate terminal 125). The first intermediate terminal 124 is a connection point between the HFET 111 and the coil 114. The capacitor 115 is connected between the second intermediate terminal 125 and the grounding terminal 122. The second intermediate terminal 125 is a connection point between the coil 114 and the output terminal 126. An anode of the LD 2 is connected to the output terminal 126, and a cathode is connected to the grounding terminal 122.

Herein, exemplified is a configuration including two switching elements (the HFET 111 and the LFET 112), but the number of the switching elements is not limited to two. For example, the HFET 111 or the LFET 112 may be configured with a circuit in which two or more MOSFETs are connected with each other in parallel.

The control circuit 113 according to the present embodiment includes a pulse control unit 117 (pulse control module) and a stop control unit. 118 (stop control module).

The pulse control unit 117 outputs an H-side modulation signal PH that switches ON/OFF of the HFET 111, and an L-side modulation signal PL that switches ON/OFF of the LFET 112. When a control timing signal ST is input to the pulse control unit 117, a pulse width (duty ratio) of the H-side modulation signal PH is determined in accordance with a voltage value of the control timing signal ST. in normal control with the synchronous rectification system, the L-side modulation signal PL is an. inverted signal of the H-side modulation signal PH, and thus the pulse width of the L-side modulation signal PL is determined when the pulse width of the H-side modulation signal PH is determined. The pulse control unit 117 causes the pulse widths of the H-side modulation signal PH and the L-side modulation signal PL to be changed in accordance with the voltage value of the control timing signal ST. The control timing signal ST may be generated by an external circuit, or may be generated inside the control circuit 113.

When the HFET 111 is switched from OFF to ON and the LFET 112 is switched from ON to OFF, a current flows through the coil. 114. When the HFET 111 is switched from ON to OFF and the LFET 112 is switched from OFF to ON, the current accumulated in the coil 114 is commutated from a GND through the LFET 112. By repeating such an operation, an optional current output is performed. When the output current Iout smoothed by the coil 114 is output, the LD 2 emits light at a timing corresponding to an output timing of the output current Iout with light intensity corresponding to a current quantity of the output current Iout. At this time, a capacitor voltage Vc rises, the capacitor voltage Vc indicating a voltage difference between both ends of the capacitor 115 connected in parallel with the LD 2. The capacitor voltage Vc is equivalent to the output voltage Vout. At the moment when the HFET 111 is switched from ON to OFF or from OFF to ON, there is a dead time in which both the HFET 111 and the LFET 112 are switched OFF. In a case in which a driving frequency is several hundred kHz, the dead time is preferably about 0.5% to 3% of one cycle. The dead time affects power supply efficiency, and should be appropriately set experimentally.

Figure 2:
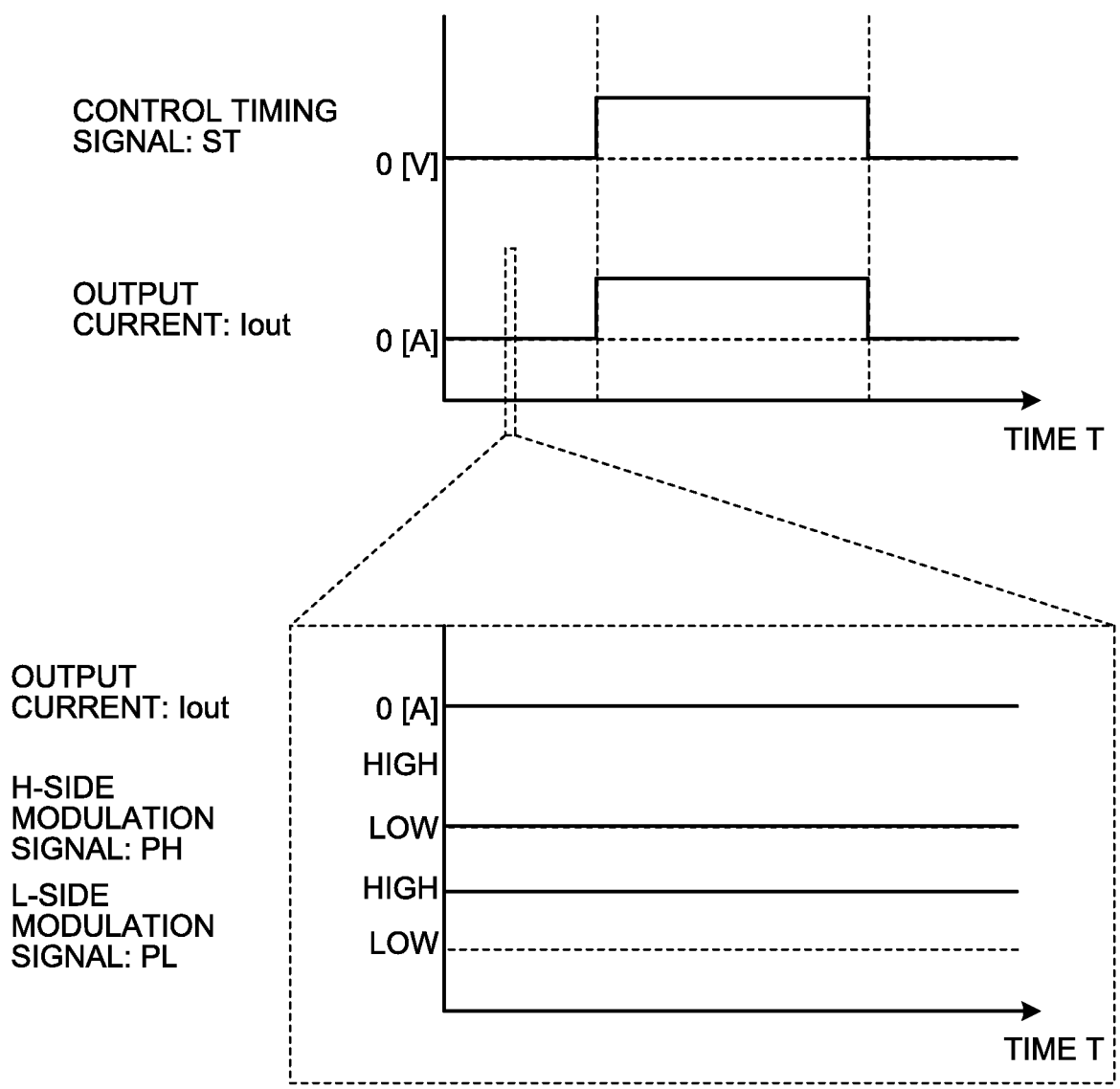
FIG. 2 is a diagram exemplifying a timing chart of a control timing signal, an output current, an H-side modulation signal, and an L-side modulation signal when the output current is not output by a drive circuit according to the first embodiment.

FIG. 2 is a diagram exemplifying a timing chart of the control timing signal ST, the output current Iout, the H-side modulation signal PH, and the L-side modulation signal PL when the output current Iout is not output by the drive circuit 101 according to the first embodiment. The dead time is not considered in the following description. As illustrated in the upper timing chart in FIG. 2, the output current Iout is output in synchronization with rising of the control timing signal ST, and output of the output current Iout is stopped in synchronization with falling of the control timing signal ST. As illustrated in the lower timing chart in FIG. 2, the H-side modulation signal PH becomes L and the L-side modulation signal PL becomes H when the output current Iout is not output.

Figure 3:
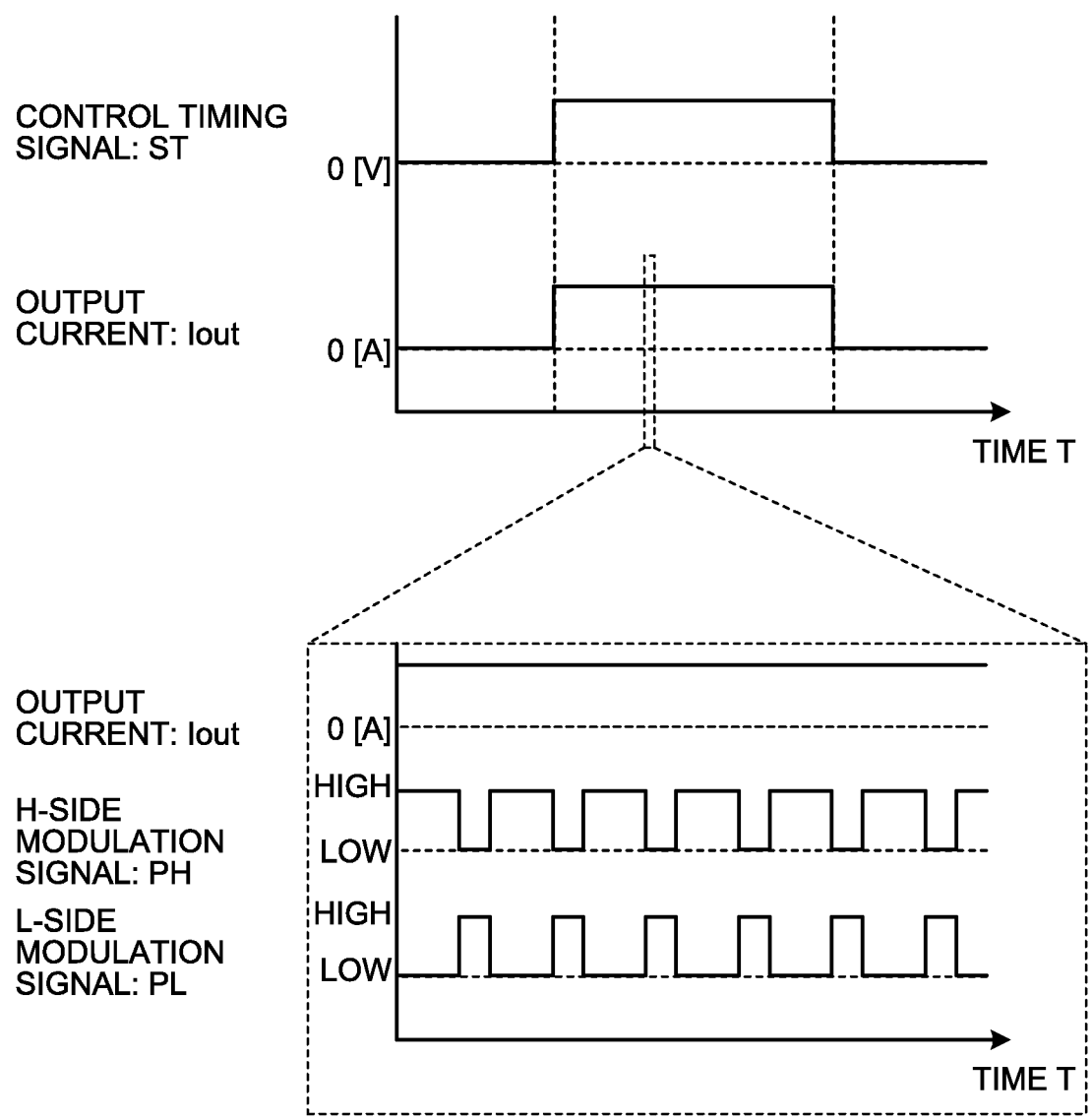
FIG. 3 is a diagram. exemplifying a timing chart of the control timing signal, the output current, the H-side modulation signal, and the L-side modulation signal when the output current is output by the drive circuit according to the first embodiment.

FIG. 3 is a diagram exemplifying a timing chart of the control timing signal ST, the output current Iout, the H-side modulation signal PH, and the L-side modulation signal PL when the output current Iout is output by the drive circuit 101 according to the first embodiment. As illustrated in the lower timing chart in FIG. 3, when the output current Iout is output, the H-side modulation signal PH oscillates with a predetermined pulse width, and the L-side modulation signal PL oscillates at a phase reversed from that of the H-side modulation signal PH.

Figure 4:
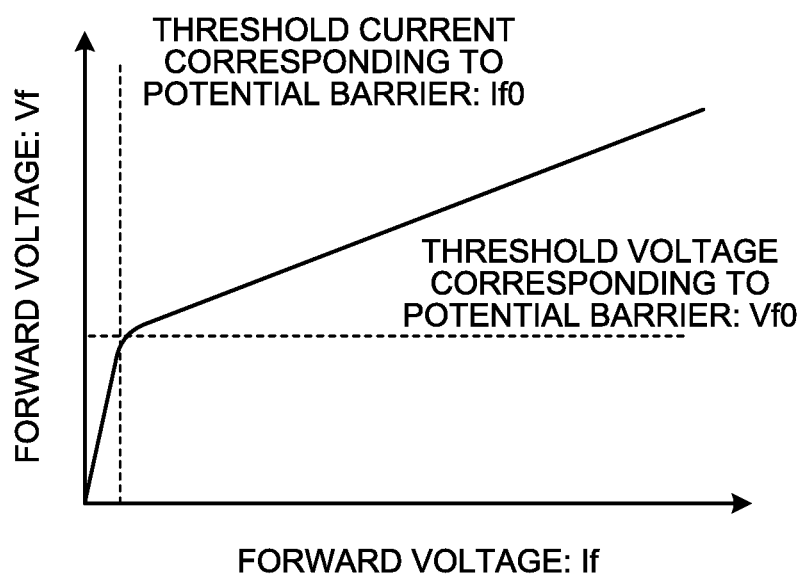
FIG. 4 is a diagram exemplifying a current/voltage characteristic of an LD according to the first embodiment.

The following describes a characteristic of the capacitor 115 and a problem caused by the capacitor 115. FIG. 4 is a diagram exemplifying a current/voltage characteristic of the LD 2 according to the first embodiment. A quantity of forward current If flowing in a forward direction in the LD 2 is very small when a forward voltage Vf applied to the LD 2 in the forward direction is lower than a threshold voltage Vf0 corresponding to a potential barrier. The potential barrier is a potential required for the LD 2 to start to be driven. When the forward voltage Vf becomes equal to or larger than the threshold voltage Vf0, the forward current If starts to rise, and the forward voltage Vf also starts to rise in accordance with the forward current If.

Figure 5:
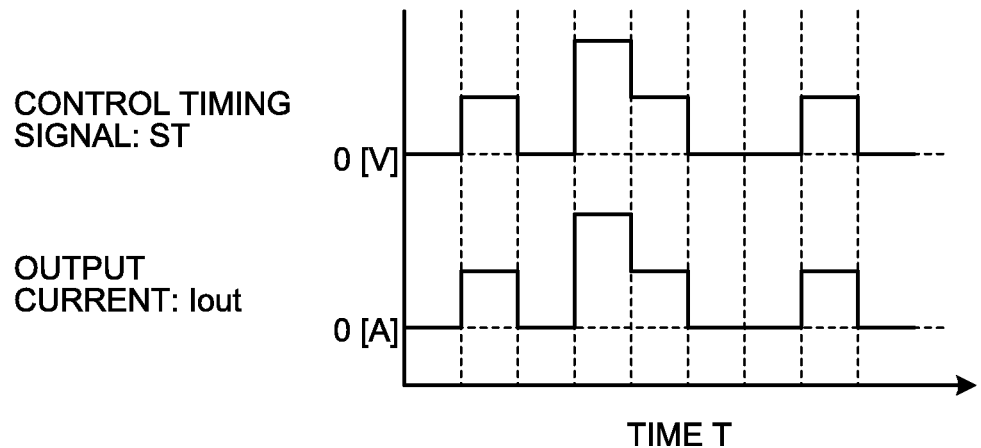
FIG. 5 is a diagram exemplifying an ideal relation between the control timing signal and the output current.

FIG. 5 is a diagram exemplifying an ideal relation between the control timing signal ST and the output current Iout. In an ideal state, delay is not caused between rising of the control timing signal ST and rising of the output current Iout.

Figure 6:
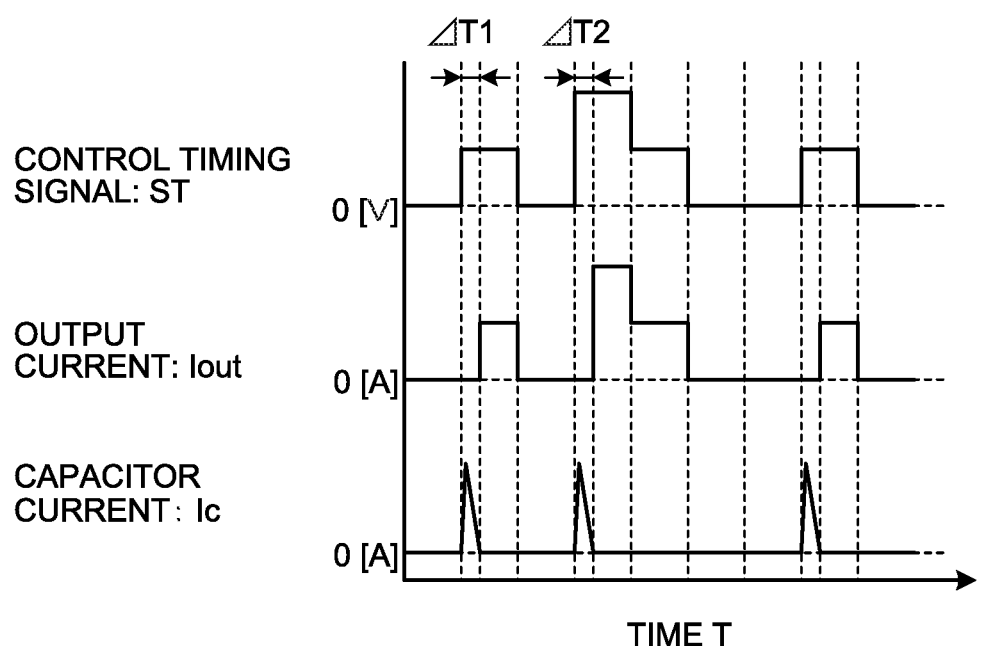
FIG. 6 is a diagram exemplifying a relation among a control timing signal, an output current, and a capacitor current according to a comparative example.

FIG. 6 is a diagram exemplifying a relation among the control timing signal ST, the output current Iout, and a capacitor current Ic according to a comparative example.

In the comparative example, delays ΔT1 and ΔT2 are caused between rising of the control timing signal ST and rising of the output current Iout. The delays ΔT1 and ΔT2 correspond to a time required for accumulating electric charges in the capacitor 115. When sufficient electric charges are not accumulated in the capacitor 115, each of the delays ΔT1 and ΔT2 is a period from when the control timing signal ST rises to when accumulation of the electric charges in the capacitor 115 is ended, that is, a time required for the capacitor current Ic flowing in the capacitor 115 to rise to a certain value and then become 0. When such a control delay is caused, accuracy in light emission control for the LD 2 is lowered. When the input voltage Vin is input to the drive circuit 101 in a state in which sufficient electric charges are not accumulated in the capacitor 115, the capacitor current Ic serves as a rush current and may damage an element such as the HFET 111.

To prevent the control delay and the rush current caused by the capacitor 115 as described above, the control circuit 113 according to the present embodiment controls the HFET 111 and the LFET 112 so that the capacitor voltage Vc does not become lower than the threshold voltage Vf0. The control circuit 113 according to the present embodiment includes the stop control unit 118. The stop control unit 118 forcibly causes the LFET 112 to be in the OFF state when the capacitor voltage Vc becomes equal to or lower than the threshold voltage Vf0. In the example illustrated in FIG. 1, the stop control unit 118 forcibly switches the electric potential of the L-side modulation signal PL output by the pulse control unit 117 to the electric potential corresponding to the OFF state (in this example, L). By causing the LFET 112 to be OFF, the electric charges accumulated in the capacitor 115 can be prevented from flowing out to the GND via the coil 114, and the capacitor voltage Vc can be prevented from being lowered.

Figure 7:
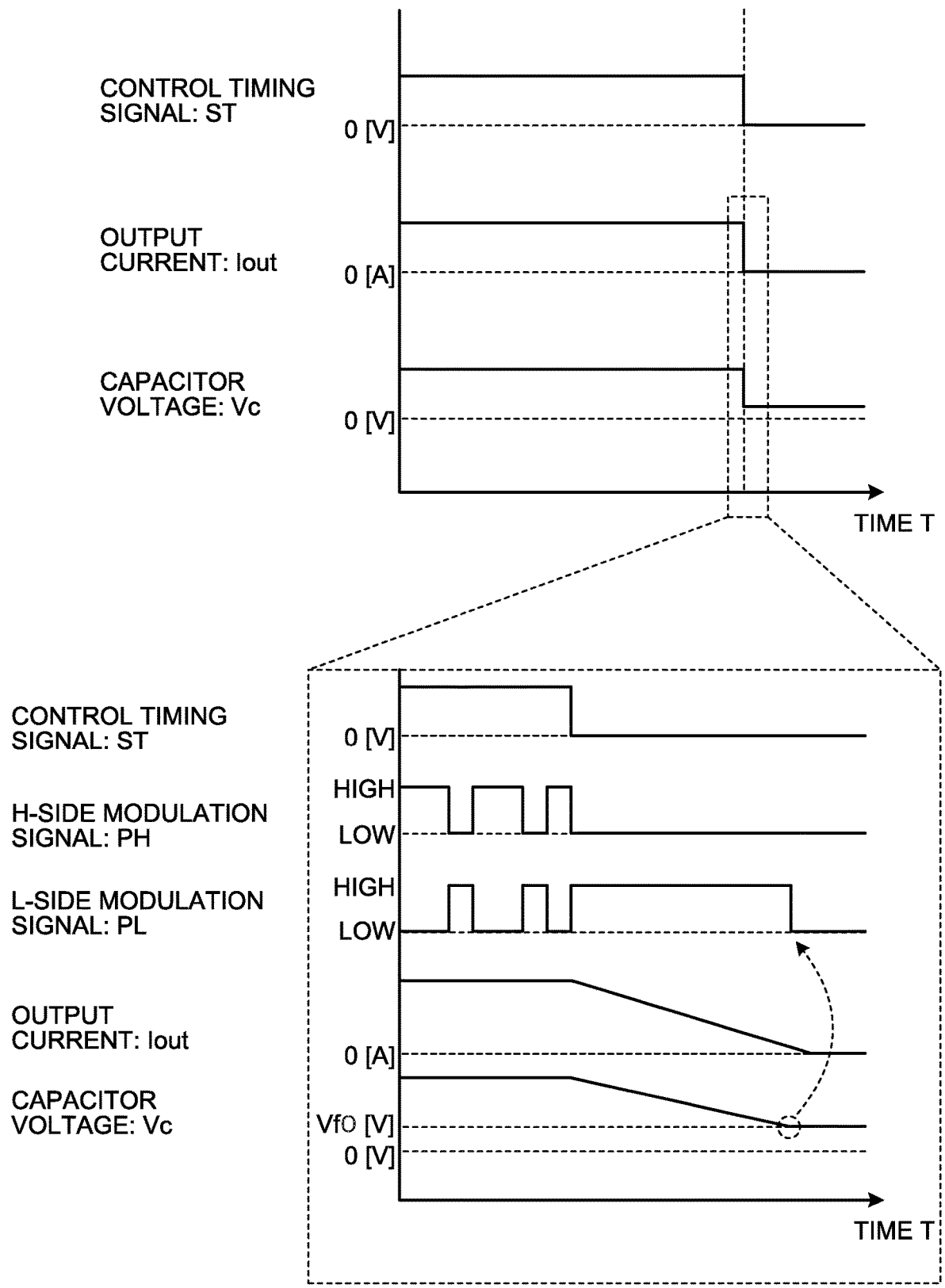
FIG. 7 is a diagram. exemplifying an operation of the drive circuit according to the first embodiment at the time when output of the output current is stopped.

FIG. 7 is a diagram exemplifying an operation of the drive circuit 101 according to the first embodiment at the time when output of the output current Iout is stopped. As illustrated in FIG. 7, when the control timing signal ST is switched from H to L, the pulse control unit 117 fixes the H-side modulation signal PH at L and fixes the L-side modulation signal at H. Due to this, the HFET 111 keeps the OFF state, and the LFET 112 keeps the ON state. At this point, accumulation of the electric charges in the capacitor 115 is stopped, and the electric charges accumulated in the capacitor 115 flow out to the GND via the coil 114, so that the capacitor voltage Vc and the output current Iout are lowered. When the capacitor voltage Vc is lowered to the threshold voltage Vf0, the stop control unit 118 forcibly switches the L-side modulation signal PL to L. Accordingly, the electric charges in the capacitor 115 are prevented from flowing out, and the capacitor voltage Vc is prevented from being lowered.

Figure 8:
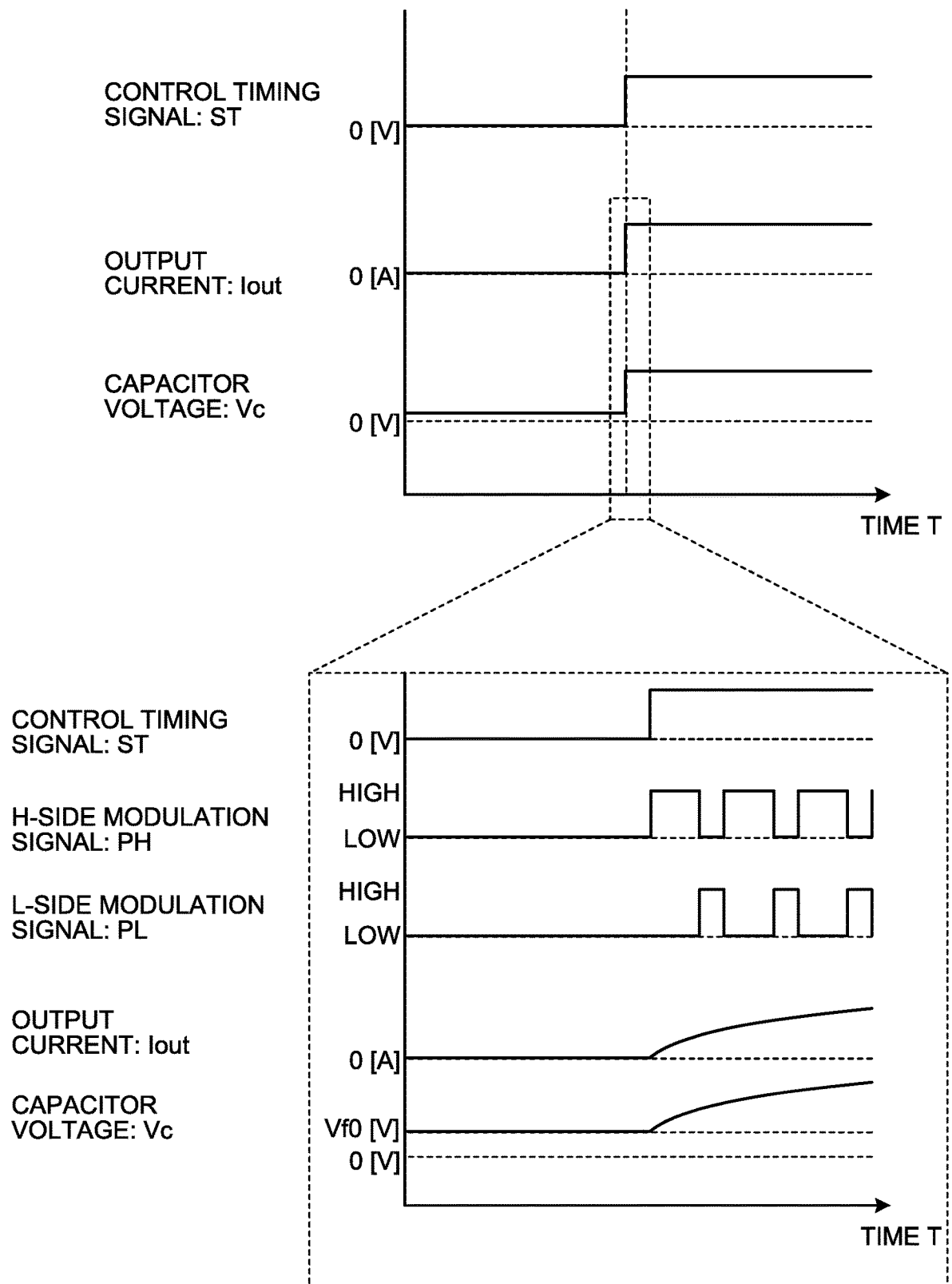
FIG. 8 is a diagram exemplifying an operation of the drive circuit according to the first embodiment at the time when output of the output current is started.

FIG. 8 is a diagram exemplifying an operation of the drive circuit 101 according to the first embodiment at the time when output of the output current Iout is started. As illustrated in FIG. 8, when the control timing signal ST is switched from L to H, the pulse control unit 117 causes the H-side modulation signal PH to oscillate with a predetermined pulse width, and causes the L-side modulation signal PL to oscillate at a phase reversed from that of the H-side modulation signal PH. Accordingly, the ON/OFF states of the HFET 111 are alternately switched at intervals corresponding to the pulse width, and the ON/OFF states of the LFET 112 are switched contrary to the HFET 111. At this point, the output current Iout and the capacitor voltage Vc rise to a value corresponding to the pulse width (duty ratio).

Due to the function of the stop control unit 118 described above, the LFET 112 is forcibly turned OFF when the capacitor voltage Vc is lowered to the threshold voltage Vf0, and the capacitor voltage Vc is prevented from being lowered. Accordingly, it is possible to prevent the control delay and the rush current caused by lowering of the capacitor voltage Vc.

To more securely prevent the capacitor voltage Vc from being lower than the threshold voltage Vf0, the pulse control unit 117 may control the HFET 111 and the LFET 112 so that a voltage is periodically applied to the capacitor 115. For example, the pulse control unit 117 may intermittently turn ON the HFET 111 with a frequency lower than a normal driving frequency, and may turn. OFF the LFET 112 to charge the capacitor 115 to a degree that the LD 2 is not driven.

The following describes an additional measure for the rush current. The configuration described above can sufficiently deal with the rush current during driving of the drive circuit 101, but cannot sufficiently deal with the rush current when the capacitor voltage Vc of the drive circuit 101 is lower than the threshold voltage Vf0 in some cases. This is because there is often a state in which the capacitor voltage Vc is lower than the threshold voltage Vf0 (in many cases, at a grounding voltage) when the capacitor voltage Vc is lower than the threshold voltage Vf0, so that the rush current cannot be prevented from being generated by simply turning OFF the LFET 112 in some cases. Thus, the pulse control unit 117 of the control circuit 113 according to the present embodiment performs control for preventing the rush current at the time when the capacitor voltage Vc of the drive circuit 101 is lower than the threshold voltage Vf0.

Figure 9:
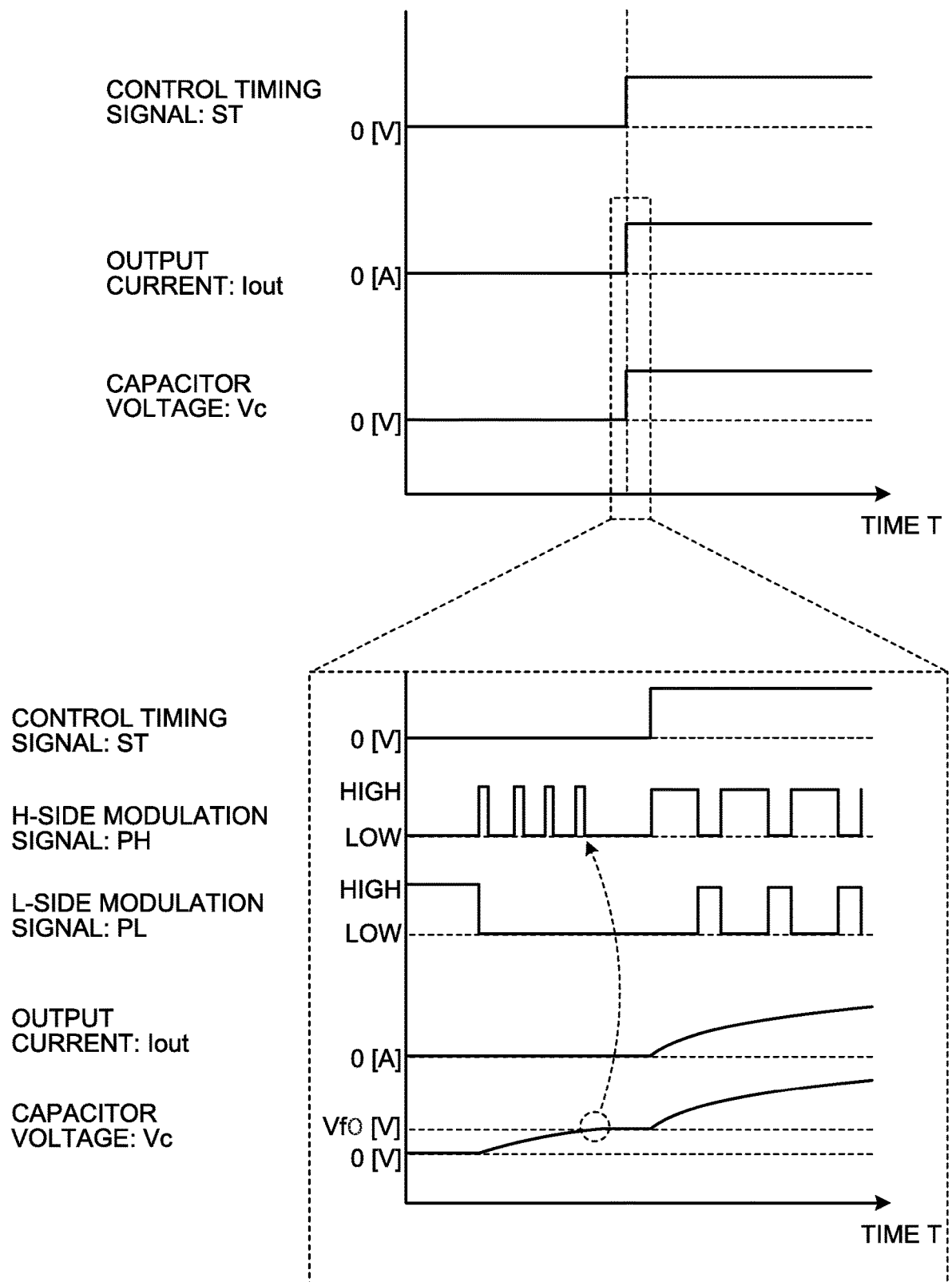
FIG. 9 is a diagram exemplifying an operation of the drive circuit according to the first embodiment at the time when output is started.

FIG. 9 is a diagram exemplifying an operation of the drive circuit 101 according to the first embodiment at the time when the capacitor voltage Vc is lower than the threshold voltage Vf0. The capacitor voltage Vc in this example is the grounding voltage (0 V) at the time of activation, for example. When the control timing signal ST is switched to H for the first time after activation, the pulse control unit 117 causes the H-side modulation signal PH to oscillate with a relatively narrow pulse width (low duty ratio) while keeping the L-side modulation signal PL at L. With such slow oscillation (slow start) of the H-side modulation signal PH at the time when the capacitor voltage Vc is lower than the threshold voltage Vf0 as described above, the capacitor voltage Vc can be caused to safely rise to the threshold voltage Vf0. After the capacitor voltage Vc reaches the threshold voltage Vf0, normal control as illustrated in FIGS. 7 and 8 is performed. Accordingly, it is possible to prevent not only the rush current during driving but also the rush current at the time when the capacitor voltage Vc is lower than the threshold voltage VF0.

In the above description, exemplified is a case of utilizing the output current Iout output by the drive circuit 101 as the driving current for the LD 2 of the light emitting device 1. However, a method of utilizing the drive circuit 101 is not limited thereto. The load to which the output current Iout of the drive circuit 101 is supplied is not limited to a light emitting element such as the LD 2, and may be various electronic devices, electric appliances, and the like.

As described above, the present embodiment can prevent the control delay and the rush current caused by voltage drop of the capacitor 115 that smoothes the output voltage Vout in the drive circuit 101 of the synchronous rectification system.

The following describes other embodiments with reference to the drawings. A portion exhibiting working effect that is the same as or similar to that of the first embodiment is denoted by the same reference numeral, and redundant description thereof is not repeated.

Second Embodiment

Figure 10:
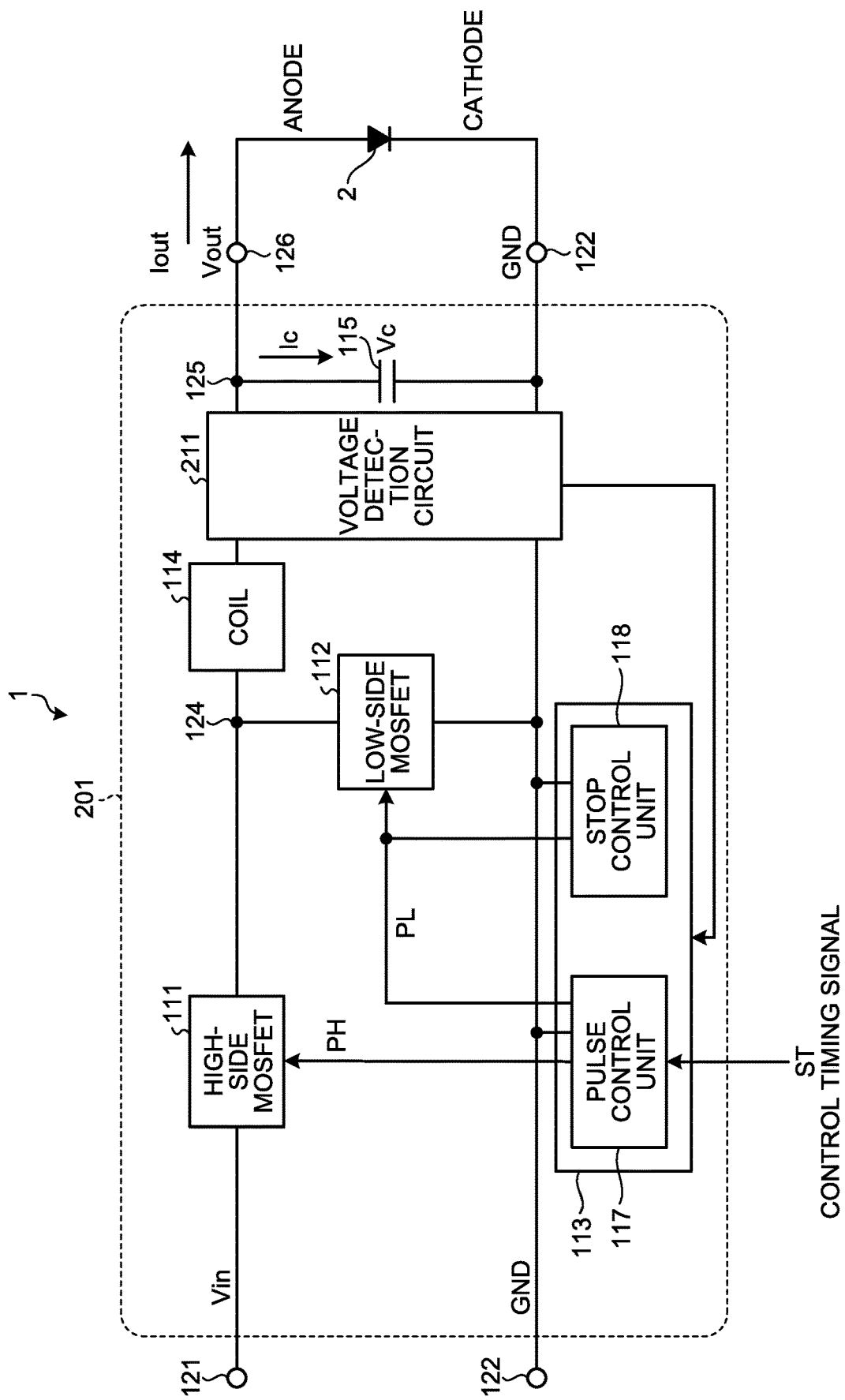
FIG. 10 is a diagram exemplifying a configuration of a light emitting device according to a second embodiment.

FIG. 10 is a diagram exemplifying a configuration of the light emitting device 1 according to a second embodiment. The LD 2 according to the present embodiment is driven by the output current Iout from the drive circuit 201.

The drive circuit 201 according to the present embodiment includes a voltage detection circuit 211 in addition to the configuration of the drive circuit 101 according to the first embodiment illustrated in FIG. 1. The voltage detection circuit 211 is a circuit that detects the capacitor voltage Vc indicating a potential difference between both ends of the capacitor 115. A specific configuration of the voltage detection circuit 211 is not specifically limited. For example, an analog circuit including a comparator, and a digital circuit that analyzes digital data converted by an A/D converter may be utilized. A connecting position of the voltage detection circuit 211 is at a preceding stage of the capacitor 115 in the example illustrated in FIG. 10, but may be at a succeeding stage of the capacitor 115.

Data indicating the capacitor voltage Vc detected by the voltage detection circuit 211 is input to the control circuit 113, and utilized for controlling the LFET 112 by the stop control unit 118. The data indicating the capacitor voltage Vc detected by the voltage detection circuit 211 may also be utilized as a feedback signal for controlling the H-side modulation signal PH and the L-side modulation signal PL by the pulse control unit 117.

With the configuration described above, the LFET 112 can be accurately controlled based on the capacitor voltage Vc that has been directly detected. Accordingly, the capacitor voltage Vc is securely prevented from being lower than the threshold voltage Vf0, and the control delay and the rush current can be securely prevented.

Third Embodiment

Figure 11:
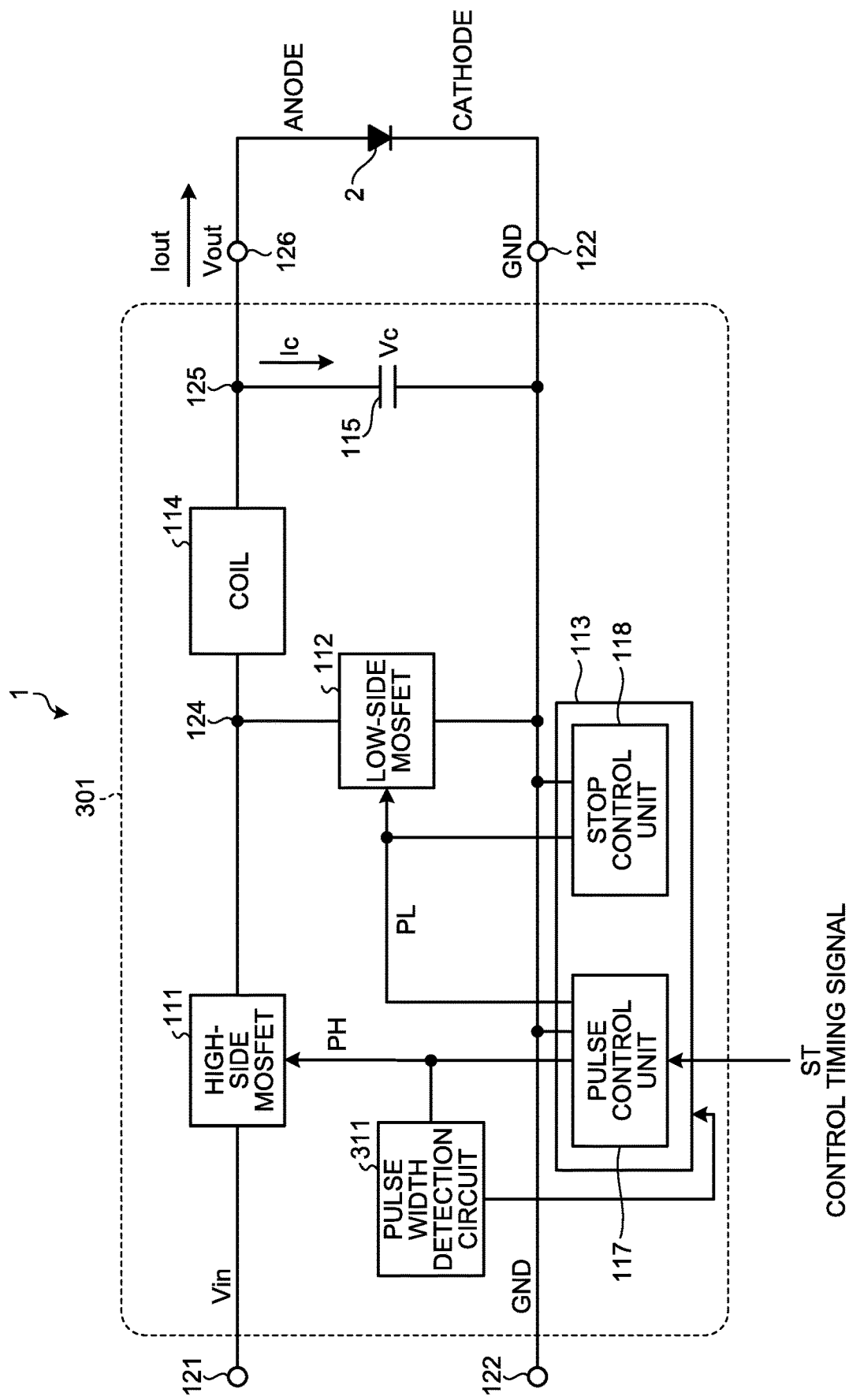
FIG. 11 is a diagram exemplifying a configuration of a light emitting device according to a third embodiment.

FIG. 11 is a diagram exemplifying a configuration of the light emitting device 1 according to a third embodiment. The LD 2 according to the present embodiment is driven by the output current Iout from a drive circuit 301.

The drive circuit 301 according to the present embodiment includes a pulse width detection circuit 311 in addition to the configuration of the drive circuit 101 according to the first embodiment illustrated in FIG. 1. The pulse width detection circuit 311 is a circuit that detects a pulse width (duty ratio) of the H-side modulation signal PH output from the pulse control unit 117 of the control circuit 113. A specific configuration of the pulse width detection circuit 311 is not specifically limited. For example, an analog circuit including a comparator and an integrator for smoothing a pulse voltage may be utilized.

Data indicating the pulse width detected by the pulse width detection circuit 311 is input to the control circuit 113. The control circuit 113 (stop control unit 118) calculates the capacitor voltage Vc based on the detected pulse width, and controls the LFET 112 so that the calculated capacitor voltage Vc does not become lower than the threshold voltage Vf0. The control circuit 113 calculates a total quantity of the current (capacitor current Ic) supplied to the capacitor 115 based on an integral value of a time (voltage) in which the phase of the H-side modulation signal PH is H, for example, and calculates the capacitor voltage Vc based on the calculated total quantity of the capacitor current Ic. The capacitor voltage Vc can be calculated even when the detected pulse width is a value related to the L-side modulation signal PL. The control circuit 113 stores table data indicating a correspondence relation between the pulse width (integral value) and the capacitor voltage Vc, for example, and may derive the capacitor voltage Vc based on the table data. The data indicating the pulse width detected by the pulse width detection circuit 311 may also be utilized as a feedback signal in control of the H-side modulation signal PH and the L-side modulation signal PL performed by the pulse control unit 117.

With the configuration described above, the LFET 112 can be controlled based on the pulse width of the modulation signal output by the pulse control unit 117, and can prevent the control delay and the rush current.

Fourth Embodiment

Figure 12:
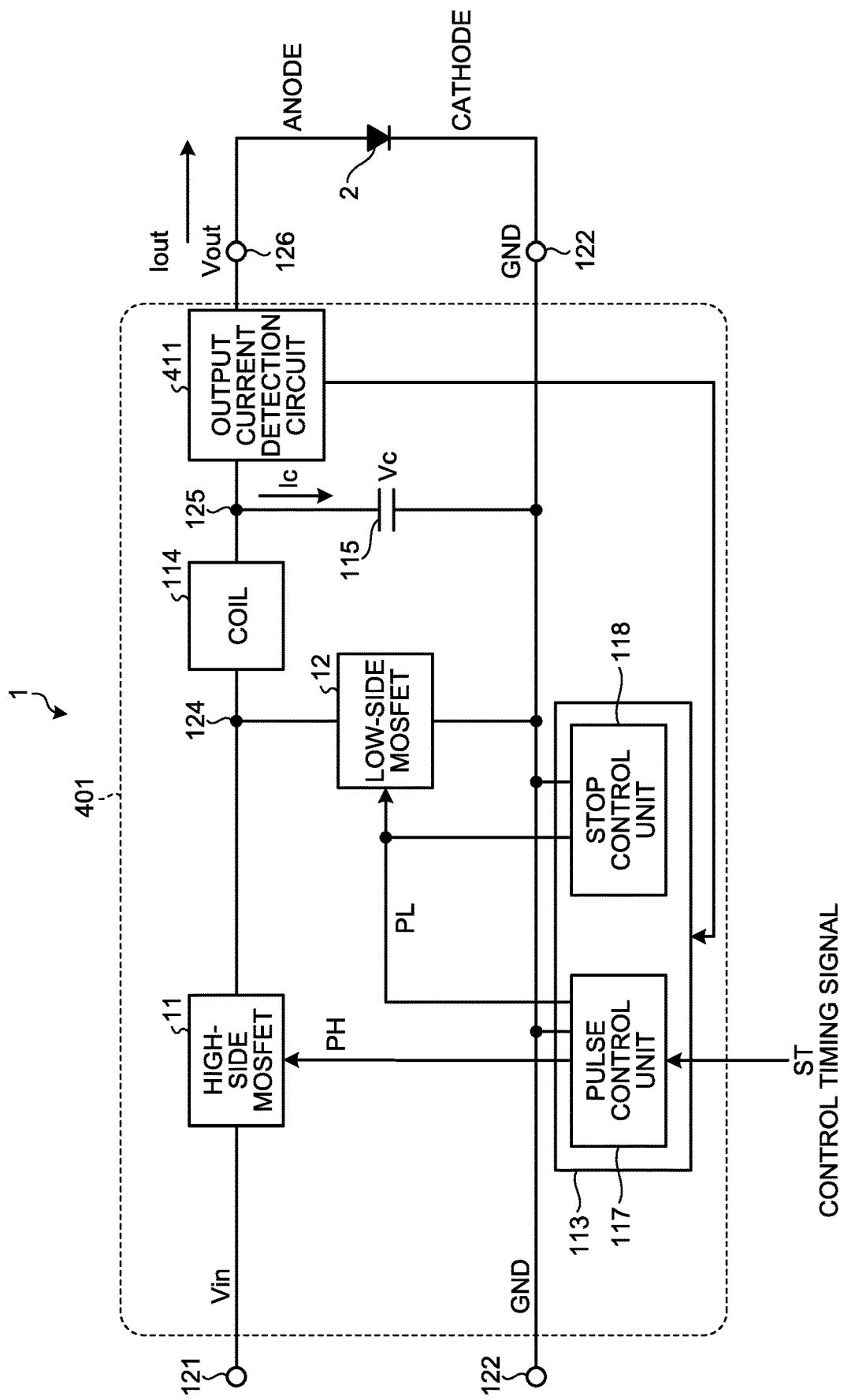
FIG. 12 is a diagram exemplifying a configuration of a light emitting device according to a fourth embodiment.

FIG. 12 is a diagram exemplifying a configuration of the light emitting device 1 according to a fourth embodiment. The LD 2 according to the present embodiment is driven by the output current Iout from a drive circuit 401.

The drive circuit 401 according to the present embodiment includes an output current detection circuit 411 in addition to the configuration of the drive circuit 101 according to the first embodiment illustrated in FIG. 1. The output current detection circuit 411 is a circuit that detects the output current Iout. A specific configuration of the output current detection circuit 411 is not specifically limited. For example, a current sensor using a hall element, a shunt resistor, and the like may be utilized. The output current detection circuit 411 in the example of FIG. 12 is connected to the succeeding stage of the capacitor 115. Accordingly, the current smoothed by the coil 114 and the capacitor 115 can be detected.

Data indicating the output current Iout detected by the output current detection circuit 411 is input to the control circuit 113. The control circuit 113 (stop control unit 118) calculates the capacitor voltage Vc based on the detected output current Iout, and controls the LFET 112 so that the calculated capacitor voltage Vc does not become lower than the threshold voltage Vf0. The control circuit 113 calculates the capacitor voltage Vc based on an integral value of the output current Iout, for example. The control circuit 113 stores table data indicating a correspondence relation between the output current Iout (integral value) and the capacitor voltage Vc, for example, and may derive the capacitor voltage Vc based on the table data. The data indicating the output current Iout detected by the output current detection circuit 411 may also be utilized as a feedback signal in control of the H-side modulation signal PH and the L-side modulation signal PL performed by the pulse control unit 117.

With the configuration described above, the LFET 112 can be controlled based on the output current Iout, and the control delay and the rush current can be prevented.

Fifth Embodiment

Figure 13:
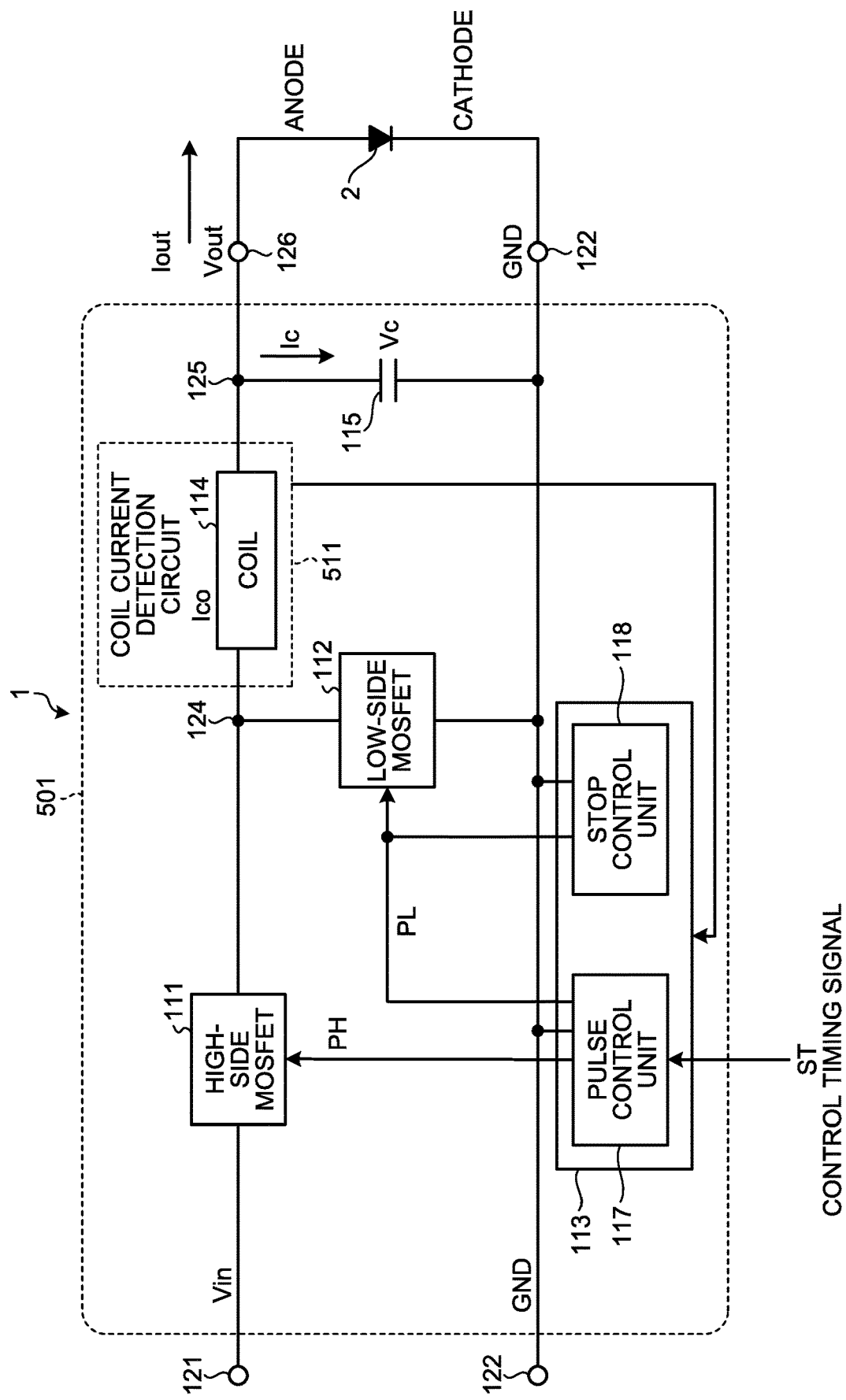
FIG. 13 is a diagram exemplifying a configuration of a light emitting device according to a fifth embodiment.

FIG. 13 is a diagram exemplifying a configuration of the light emitting device 1 according to a fifth embodiment. The LD 2 according to the present embodiment is driven by the output current Iout from a drive circuit 501.

The drive circuit 501 according to the present embodiment includes a coil current detection circuit 511 in addition to the configuration of the drive circuit 101 according to the first embodiment illustrated in FIG. 1. The coil current detection circuit 511 is a circuit that detects a coil current Ico that flows through the coil 114. A specific configuration of the coil current detection circuit 511 is not specifically limited. For example, a circuit and the like that obtain the coil current Ico from an output current value of a sub-winding wound around the coil 114 may be utilized, for example.

Data indicating the coil current Ico detected by the coil current detection circuit 511 is input to the control circuit 113. The control circuit 113 (stop control unit 118) calculates the capacitor voltage Vc based on the detected coil current Ico, and controls the LFET 112 so that the calculated capacitor voltage Vc does not become lower than the threshold voltage Vf0. The control circuit 113 calculates the capacitor voltage Vc based on the integral value of the coil current Ico, for example. The control circuit 113 stores table data indicating a correspondence relation between the coil current Ico (integral value) and the capacitor voltage Vc, for example, and may derive the capacitor voltage Vc based on the table data. The data indicating the coil current Ico detected by the coil current detection circuit 511 may also be utilized as a feedback signal in control of the H-side modulation signal PH and the L-side modulation signal PL performed by the pulse control unit 117.

With the configuration described above, the LFET 112 can be controlled based on the coil current Ico, and the control delay and the rush current can be prevented.

Sixth Embodiment

Figure 14:
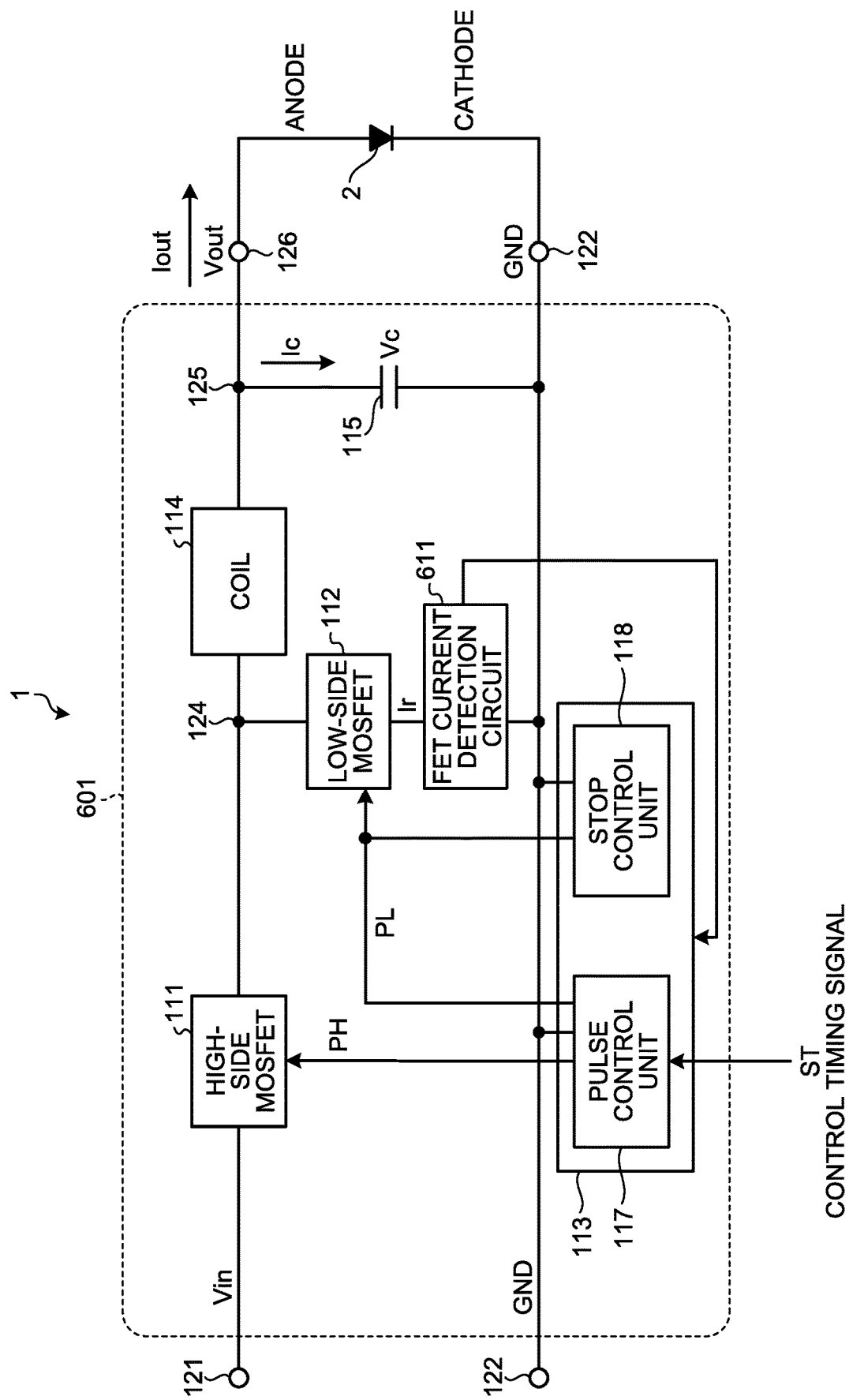
FIG. 14 is a diagram exemplifying a configuration of a light emitting device according to a sixth embodiment.

FIG. 14 is a diagram exemplifying a configuration of the light emitting device 1 according to a sixth embodiment. The LD 2 according to the present embodiment is driven by the output current Iout from a drive circuit 601.

The drive circuit 601 according to the present embodiment includes an FET current detection circuit 611 in addition to the configuration of the drive circuit 101 according to the first embodiment illustrated in FIG. 1. The FET current detection circuit 611 is a circuit that detects an outflow current Ir that flows from the LFET 112 to the grounding terminal 122. A specific configuration of the FET current detection circuit 611 is not specifically limited. A current sensor using a hail element, a shunt resistor, and the like may be utilized. The FET current detection circuit 611 in the example of FIG. 14 is connected in series between the LFET 112 and the grounding terminal 122.

Data indicating the outflow current Ir detected by the FET current detection circuit 611 is input to the control circuit 113. The control circuit 113 (stop control unit 118) calculates the capacitor voltage Vc based on the detected outflow current. Ir, and controls the LFET 112 so that the calculated capacitor voltage Vc does not become lower than the threshold voltage Vf0. The control circuit 113 calculates the capacitor voltage Vc based on the integral value of the outflow current Ir, for example. The control circuit 113 stores table data indicating a correspondence relation between the outflow current Ir (integral value) and the capacitor voltage Vc, for example, and may derive the capacitor voltage Vc based on the table data. The data indicating the outflow current Ir detected by the FET current detection circuit 611 may also be utilized as a feedback signal in control of the H-side modulation signal PH and the L-side modulation signal PL performed by the pulse control unit 117.

With the configuration described above, the LFET 112 can be controlled based on the outflow current Ir flowing out from the LFET 112 to the GND, and the control delay and the rush current can be prevented.

Seventh Embodiment

Figure 15:
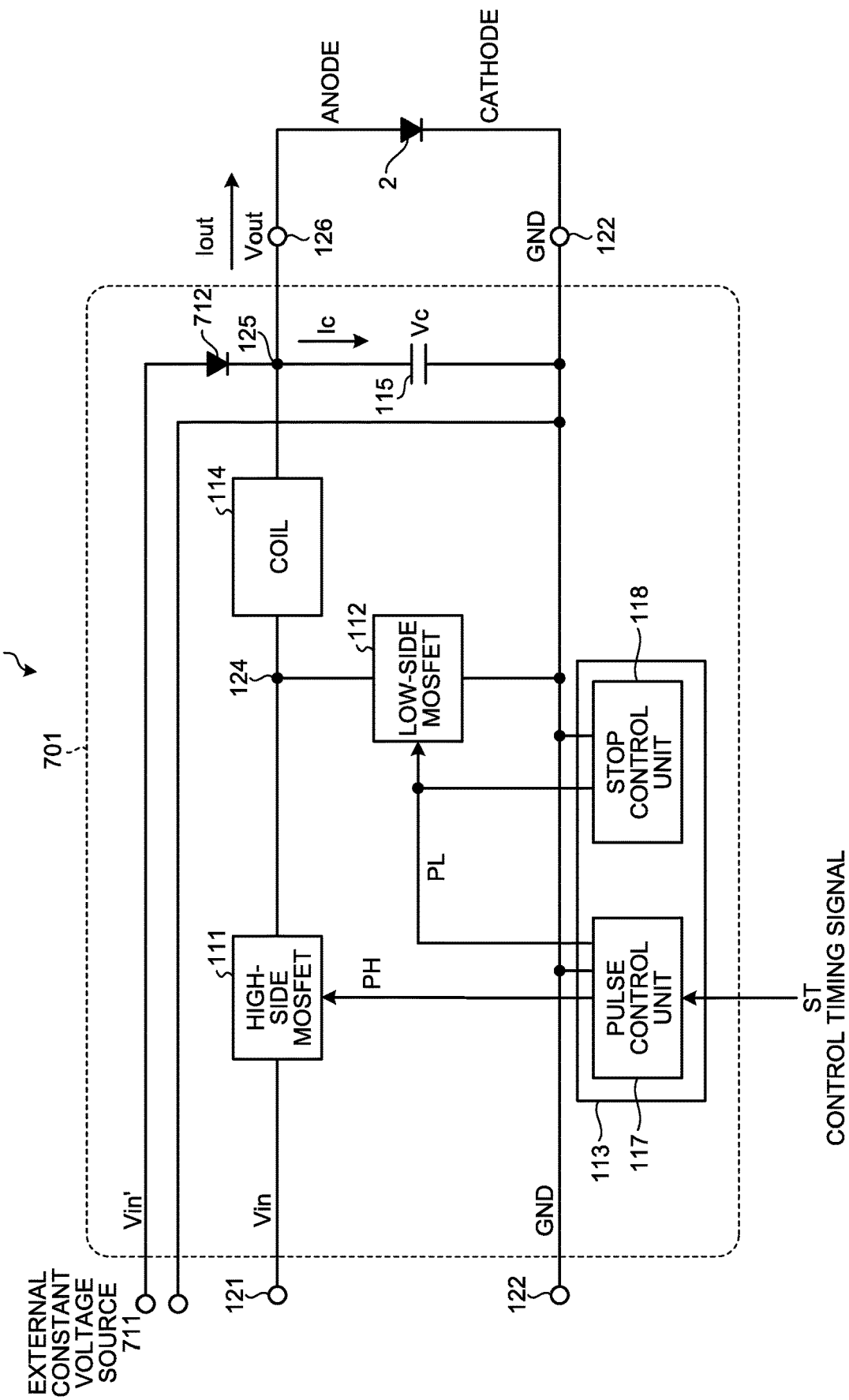
FIG. 15 is a diagram exemplifying a configuration of a light emitting device according to a seventh embodiment.

FIG. 15 is a diagram exemplifying a configuration of the light emitting device 1 according to a seventh embodiment. The LD 2 according to the present embodiment is driven by the output current Iout from a drive circuit 701.

The drive circuit 701 according to the present embodiment includes an external constant voltage source 711 (external power supply) and a diode 712 (rectifier) in addition to the configuration of the drive circuit 101 according to the first embodiment illustrated in FIG. 1. The external constant voltage source 711 is a voltage source that is arranged independently of a constant voltage source that outputs the input voltage Vin, and outputs an external input voltage Vin'. The diode 712 limits a flow of the current (capacitor current Ic) generated by the external input voltage Vin' to one direction (prevents backflow). The external constant voltage source 711 and the diode 712 are connected to each other so that the external input voltage Vin' is directly supplied to the capacitor 115. The external input voltage Vin' should be set considering a driving voltage for the diode 712.

By constantly supplying the voltage to the capacitor 115 as in the above configuration, it is possible to more securely prevent the capacitor voltage Vc from being lower than the threshold voltage Vf0.

Eighth Embodiment

FIG. 16 is a diagram exemplifying a configuration of the light emitting device 1 according to an eighth embodiment. The LD 2 according to the present embodiment is driven by the output current Iout from a drive circuit 801.

The drive circuit 801 according to the present embodiment includes a pulse control circuit 811 (pulse control module) and a stop control circuit 812 (stop control module). The pulse control circuit 811 is an independent circuit having the same function as that of the pulse control unit 117 in the control circuit 113 according to the first embodiment illustrated in FIG. 1. The stop control circuit 812 is an independent circuit having the same function as that of the stop control unit 118 in the control circuit 113 according to the first embodiment illustrated in FIG. 1.

As in the above configuration, each of a functional part for alternately switching between the ON/OFF states of the HFET 111 and the LFET 112 (a functional part corresponding to the pulse control unit 117) and a functional part for forcibly causing the LFET 112 to be in the OFF state (a functional part corresponding to the stop control unit 118) may be configured as an independent circuit.

According to the present invention, in the drive circuit of the synchronous rectification system, a control delay and a rush current can be prevented from being generated.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

What is claimed is:

1. A drive circuit configured to supply a current to a light emitting element, the drive circuit comprising:
   a plurality of switching elements configured to switch between ON/OFF states with a modulation signal;
   a capacitor connected in parallel with the light emitting element; and
   a control module configured to control the plurality of switching elements, wherein
   the plurality of switching elements include a first switching element configured to switch between ON/OFF states of an electric path connecting a power supply potential with the capacitor, and a second switching element configured to switch between ON/OFF states of an electric path connecting the capacitor with a ground potential,
   the control module includes a pulse control module configured to control the modulation signal so that the ON/OFF states of the first switching element is contrary to the ON/OFF states of the second switching element, and a stop control module configured to control the modulation signal so that the second switching element is caused to be in the OFF state when a voltage of the capacitor becomes equal to or relatively smaller than a threshold,
   the pulse control module is configured to output a first modulation signal to switch ON/OFF states of the first switching element, and a second modulation signal to switch ON/OFF states of the second switching element, and configured to cause the first modulation signal to oscillate with a set pulse width, and cause the second modulation signal to oscillate at a phase reversed from that of the first modulation signal, and
   the pulse control module is configured to, at a time when the voltage of the capacitor is relatively lower than the threshold, cause the first modulation signal to oscillate with a pulse width relatively narrower than the set pulse width while keeping the second modulation signal at an electric potential corresponding to the OFF state.

2. The drive circuit according to claim 1, further comprising:
   a voltage detection module configured to detect a potential difference between both ends of the capacitor, wherein
   the stop control module controls the modulation signal based on the potential difference detected by the voltage detection module.

3. The drive circuit according to claim 1, further comprising:
   a first current detection module configured to detect an output current supplied to the light emitting element, wherein
   the stop control module controls the modulation signal based on the current detected by the first current detection module.

4. The drive circuit according to claim 1, further comprising:
   an inductor to which a current is input when the first switching element is in an ON state; and
   a second current detection module configured to detect the current flowing through the inductor, wherein
   the stop control module controls the modulation signal based on the current detected by the second current detection module.

5. The drive circuit according to claim 1, further comprising:
   a first pulse detection module configured to detect a pulse width of the modulation signal, wherein
   the stop control module controls the modulation signal based on the pulse width detected by the first pulse detection module.

6. The drive circuit according to claim 1, wherein the control module controls the plurality of switching elements so that a voltage is periodically applied to the capacitor.

7. The drive circuit according to claim 1, further comprising:
   an external power supply configured to directly supply a voltage to the capacitor; and
   a rectifier configured to limit a current flow between the external power supply and the capacitor to a certain direction.

8. The drive circuit according to claim 1, wherein the threshold is a voltage value corresponding to a potential barrier at which a current starts to flow through the light emitting element.

9. A light emitting device comprising a light emitting element configured to be driven by a current supplied by the drive circuit according to claim 1.

10. A drive circuit configured to supply a current to a light emitting element, the drive circuit comprising:
- a capacitor connected in parallel with the light emitting element;
- a plurality of switching elements configured to switch between ON/OFF states with a modulation signal, the plurality of switching elements including a first switching element configured to switch between ON/OFF states of an electric path connecting a power supply potential with the capacitor, and a second switching element configured to switch between ON/OFF states of an electric path connecting the capacitor with a ground potential;
- a first memory storing computer-readable instructions; and
- one or more processors configured to execute computer-readable instructions to
  - control the plurality of switching elements, wherein
  - control the modulation signal so that the ON/OFF states of the first switching element is contrary to the ON/OFF states of the second switching element, and
  - a stop control module configured to control the modulation signal so that the second switching element is caused to be in the OFF state when a voltage of the capacitor becomes equal to or relatively smaller than a threshold,
  - output a first modulation signal to switch ON/OFF states of the first switching element, and a second modulation signal to switch ON/OFF states of the second switching element, and configured to cause the first modulation signal to oscillate with a pulse width, and cause the second modulation signal to oscillate at a phase reversed from that of the first modulation signal, and
  - cause the first modulation signal, at a time when the voltage of the capacitor is relatively lower than the threshold, to oscillate with a pulse width relatively narrower than the pulse width while keeping the second modulation signal at an electric potential corresponding to the OFF state.

11. The drive circuit according to claim 10, further comprising:
- a voltage detection module configured to detect a potential difference between both ends of the capacitor, wherein
  the stop control module controls the modulation signal based on the potential difference detected by the voltage detection module.

12. The drive circuit according to claim 10, further comprising:
- a first current detection module configured to detect an output current supplied to the light emitting element, wherein
  the stop control module controls the modulation signal based on the current detected by the first current detection module.

13. The drive circuit according to claim 10, further comprising:
- an inductor to which a current is input when the first switching element is in an ON state; and
- a second current detection module configured to detect the current flowing through the inductor, wherein
  the stop control module controls the modulation signal based on the current detected by the second current detection module.

14. The drive circuit according to claim 10, further comprising:
- a first pulse detection module configured to detect a pulse width of the modulation signal, wherein
  the stop control module controls the modulation signal based on the pulse width detected by the first pulse detection module.

15. The drive circuit according to claim 10, wherein the control module controls the switching elements so that a voltage is periodically applied to the capacitor.

16. The drive circuit according to claim 10, further comprising:
- an external power supply configured to directly supply a voltage to the capacitor; and
- a rectifier configured to limit a current flow between the external power supply and the capacitor to a certain direction.

17. The drive circuit according to claim 10, wherein the threshold is a voltage value corresponding to a potential barrier at which a current starts to flow through the light emitting element.

18. A light emitting device comprising a light emitting element configured to be driven by a current supplied by the drive circuit according to claim 10.

* * * * *

UNITED STATES PATENT AND TRADEMARK OFFICE
CERTIFICATE OF CORRECTION

Page 1 of 1

PATENT NO. : 10,530,123 B2
APPLICATION NO. : 15/918154
DATED : January 7, 2020
INVENTOR(S) : Yuuki Oka et al.

It is certified that error appears in the above-identified patent and that said Letters Patent is hereby corrected as shown below:

On the Title Page

(73) Assignee should read:
Ricoh Company, Ltd., Tokyo (JP)
Kyushu Institute of Technology, Fukuoka (JP)

Signed and Sealed this
Thirtieth Day of June, 2020

Andrei Iancu
*Director of the United States Patent and Trademark Office*